(12) United States Patent
Leep et al.

(10) Patent No.: US 7,307,700 B1
(45) Date of Patent: Dec. 11, 2007

(54) ULTRA-LINEAR SIGNAL PROCESSING FOR RADAR AND LASER RADAR

(75) Inventors: David A. Leep, Des Moines, WA (US); David C. Soreide, Seattle, WA (US); John A. Bell, Issaquah, WA (US); Ronald L. Hagman, Pinehurst, ID (US)

(73) Assignee: The Boeing Company, Chicago, IL (US)

( * ) Notice: Subject to any disclaimer, the term of this patent is extended or adjusted under 35 U.S.C. 154(b) by 203 days.

(21) Appl. No.: 11/014,919

(22) Filed: Dec. 17, 2004

(51) Int. Cl.
*G01C 3/08* (2006.01)
(52) U.S. Cl. .................. 356/5.15; 356/5.1; 356/5.01
(58) Field of Classification Search .............. 356/5.15
See application file for complete search history.

(56) References Cited

U.S. PATENT DOCUMENTS 5,030,824 A    7/1991  Babbitt
5,371,587 A   12/1994  de Groot et al.
6,839,471 B1*  1/2005  Vogt, IV ..................... 382/280
2006/0061772 A1*  3/2006  Kulawiec et al. ........... 356/511

* cited by examiner

*Primary Examiner*—Thomas H. Tarcza
*Assistant Examiner*—Luke D. Ratcliffe
(74) *Attorney, Agent, or Firm*—Robert R. Richardson, P.S.

(57) ABSTRACT

Systems, methods, and computer program products are provided for accurately measuring frequency-and/or-phase-related parameters of a sinusoidal signal that varies non-linearly in frequency or phase. A sinusoidal signal is sampled over a finite period of time at a plurality of sample points. The sampled signals are pre-processed, and a Fourier transform is performed on the pre-processed sampled signals. Phases of the pre-processed sampled signals are extracted from the Fourier transform, and a measurement indicative of frequency of the sinusoidal signal is determined from slope of the phases of the pre-processed sampled signals. Range to a target may be determined using the exemplary signal processing described above on laser radar interference signals.

10 Claims, 6 Drawing Sheets

ULTRA-LINEAR SIGNAL PROCESSING FOR RADAR AND LASER RADAR

FIELD OF THE INVENTION

This invention relates generally to signal processing and, more specifically, to systems and methods for processing radar signals.

BACKGROUND OF THE INVENTION

Radio detection and ranging (radar) is used to detect, range (that is, determine a distance), and map a wide variety of objects. For example, a weather radar system on an airplane can detect and range rain or other weather events, and a military fire control radar system can detect and track a military target, such as a ship or an aircraft.

Radar can also be used to range and map objects for manufacturing purposes. For example, laser radar is particularly well-suited for manufacturing large-scale objects (such as aircraft) because laser radar allows precise measurement over a large volume. In one approach referred to as a chirped or Frequency Modulated-Continuous Wave (FMCW) radar, the radar frequency is modulated linearly (or nearly linearly).

In an FMCW radar, there is a time delay between the time when the signal is sent to an object and the time when the radiation scattered from the object is collected. As a result, there is a frequency difference between the radiation that is transmitted and the radiation that is collected. If these two signals with different frequencies are mixed, a beat frequency is observed. If the chirp is linear, then the beat frequency is proportional to the time delay and, therefore, to the range to the scattering object. If the chirp is not linear, then measuring range with a chirped radar entails measuring a sinusoidal signal that is varying in frequency (or, equivalency, in phase) in an environment of random noise.

In practical laser radar systems, the frequency or phase of the sinusoidal signal will vary—often by as much as ten percent. Because the frequency or phase of the sinusoid varies in time, a broad peak is obtained via a Fourier transform, such as a Fast Fourier Transform (FFT) of the entire interval. The broad peak reduces accuracy of measurement of frequency or phase of the sinusoid.

It would be desirable to measure accurately parameters of a signal with a narrow frequency that wanders. However, there is an unmet need in the art for a system and method for accommodating wandering in frequency or phase to permit accurately measuring frequency-and/or-phase-related parameters of a laser radar signal.

SUMMARY OF THE INVENTION

Embodiments of the present invention provide a system, method, and computer program product for performing accurate measurements of frequency-and/or-phase-related parameters of a sinusoidal signal that varies non-linearly in frequency or phase. Advantageously, according to other embodiments of the present invention, measurements of frequency-and/or-phase-related parameters of such a sinusoidal signal are used to determine range to a target. As a result, embodiments of the present invention are able to provide more accurate range measurements than have been possible in the prior art.

According to an embodiment of the present invention, a measurement indicative of frequency and/or phase of a sinusoidal signal that varies non-linearly in frequency or phase is accurately measured. A sinusoidal signal is sampled over a finite period of time at a plurality of sample points. The sampled signals are pre-processed, and a Fourier transform is performed on the pre-processed sampled signals. Phases of the pre-processed sampled signals are extracted from the Fourier transform, and a measurement indicative of frequency of the sinusoidal signal is determined from slope of the phases of the pre-processed sampled signals.

According to an aspect of the present invention, pre-processing may include filtering (or windowing) the sampled signal. If desired, the filter may include a Kaiser-Bessel window. Pre-processing may also include padding the filtered, sampled signal by adding to the filtered, sampled signal a plurality of sample points that are all zeroes. Pre-processing may also include rotating the filtered padded sample by a predetermined amount, such as without limitation around twenty-five percent or so.

According to another aspect of the present invention, determining frequency from the slope of the phases of the pre-processed sampled signals may include performing a linear fit through a plurality of phase data points.

According to another embodiment of the present invention, range to a target is determined using the exemplary signal processing described above. Two single-mode laser beams having a relative frequency separation are frequency modulated. The two frequency-modulated laser beams are combined, and the combined laser beams are projected onto a target. A return signal from the target and a portion of the combined laser beams are mixed, and the mixed signal is detected. At least one reference signal is generated. The detected mixed signal is pre-processed, and a Fourier transform is performed on the pre-processed signal. Phase of the mixed signal is extracted from the Fourier transform, and a measurement indicative of frequency of the mixed signal is determined from slope of the phase of the mixed signal. Range to the target is determined based on a comparison of either phase or frequency of the mixed signal with either phase or frequency of at least one reference signal.

BRIEF DESCRIPTION OF THE DRAWINGS

The preferred and alternative embodiments of the present invention are described in detail below with reference to the following drawings.

DETAILED DESCRIPTION OF THE INVENTION

Embodiments of the present invention provide a system, method, and computer program product for enabling accurate measurement of frequency-and/or-phase-related parameters of a sinusoidal signal that varies non-linearly in frequency or phase. Advantageously, according to other embodiments of the present invention, measurements of frequency and/or phase of such a sinusoidal signal are used to determine range to a target. As a result, embodiments of the present invention are able to provide more accurate range measurements than have been possible in the prior art.

An exemplary system environment suitable for determining range to a target will first be explained. Next, details will be set forth regarding exemplary signal processing that can accurately measure phase-and/or-frequency-related parameters of a sinusoidal signal according to embodiments of the present invention.

Exemplary System Environment

Figure 1:
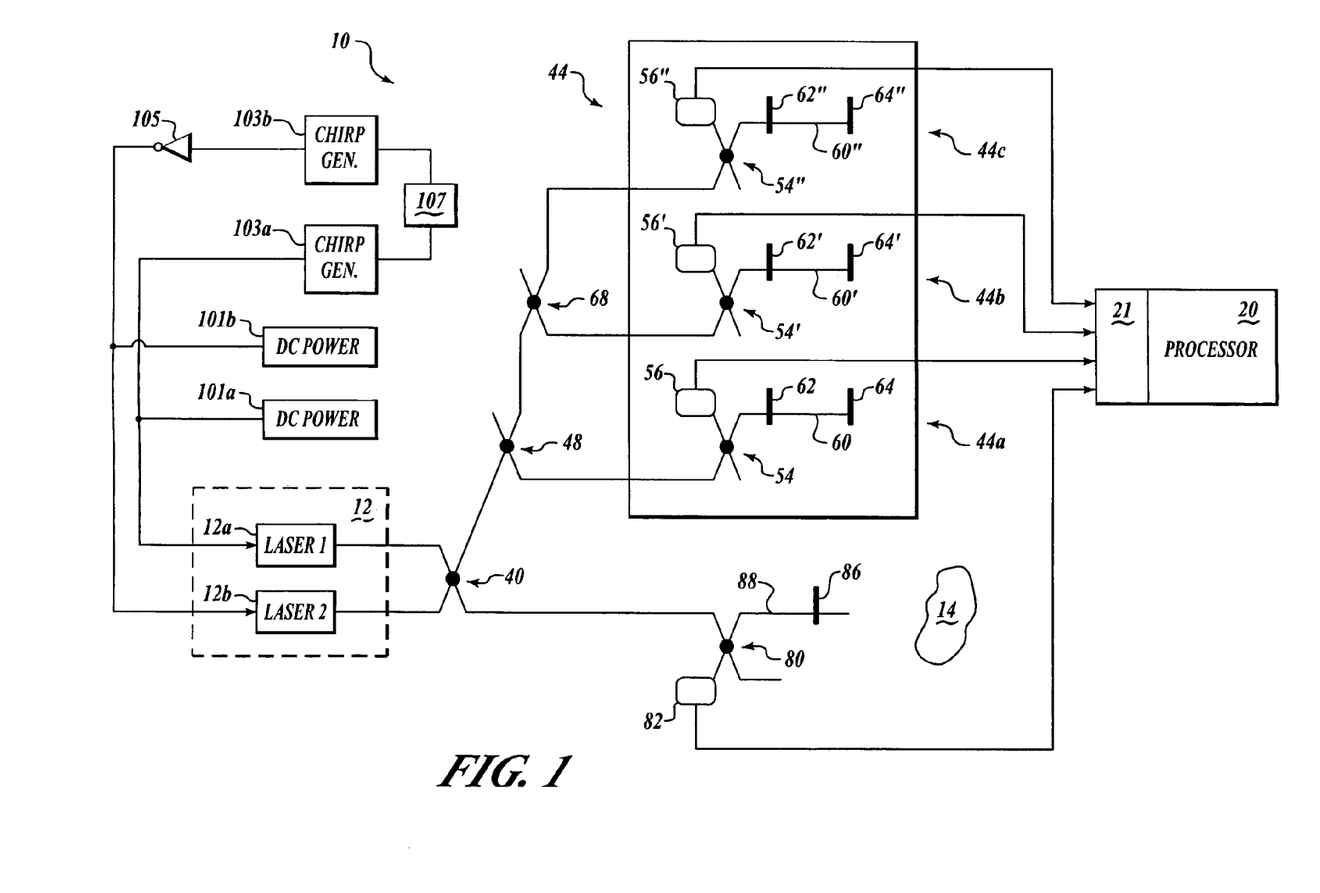
FIG. 1 is a block diagram of a system for determining range to a target according to an embodiment of the present invention.

Referring now to FIG. 1, an exemplary system 10 determines range to a target 14 according to an embodiment of the present invention. The system 10 includes a two-frequency laser source 12, and a reference interferometer 44 including reference channels 44a, 44b, and 44c. In a present embodiment, the system 10 has a maximum operating range of around 4 meters with a range resolution of around 0.02 mm. Another present embodiment has a maximum operating range of around 8 meters with a range resolution of around 0.02 mm. However, it will be appreciated that the system 10 may have any maximum operating range and range resolution as desired for a particular application. It will also be appreciated that the laser source 12 may include more than two lasers and the reference interferometer 44 may include more than three reference channels, if desired.

Advantageously, the system 10 is able to measure distance to a non-cooperative target—that is, a target that does not include retro-reflectors or fiducials. The system 10 is similar to optics and signal processing subsystems set forth in U.S. Patent Application entitled "Method and Apparatus for Combining a Targetless Optical Measurement Function with Optical Projection of Information", the contents of which are incorporated by reference.

The laser 12 includes a first laser diode 12a and a second laser diode 12b. DC power source 101a and 101b provide a DC bias current to the lasers 12a and 12b that operate at wavelengths that are different from each other. Given by way of nonlimiting example, the lasers 12a and 12b may include distributed feedback (DFB) laser diodes. It is preferable that the laser diodes 12a and 12b have high output power. A nonlimiting example of an exemplary laser diode is the JDS Uniphase model CQF-935/708. Other acceptable diodes include external cavity diode lasers, such as the New Focus TLB-6000. Given by way of non-limiting example, the first laser diode 12a suitably has a wavelength $\lambda_1$ of around 1550 nanometers (nm) and the second laser diode 12b suitably has a wavelength $\lambda_2$ of around 1550.6 nm. The wavelengths $\lambda_1$ and $\lambda_2$ correspond to frequencies that differ from each other by around 100 GHz or so. While any wavelength may be selected as desired for a particular application, it is important that the wavelengths $\lambda_1$ and $\lambda_2$ be different from each other. This difference in wavelengths enables generation of an interference pattern that will be processed to determine range to the target 14, as will be discussed below.

The first and second laser diodes 12a and 12b are frequency-modulated by chirp generators 103a and 103b, respectively. The chirp generators 104a and 104b suitably provide a triangle-wave modulation to the bias currents that drive the lasers. The lasers respond to the varying drive current by shifting in operating frequency. When the lasers 12a and 12b are DFB lasers, modulation frequency of the triangle wave is limited to around 3000 Hz. If external cavity lasers are used, the modulation frequency is slower. An exemplary modulation frequency used with external cavity lasers is around 100 Hz. Output of the chirp generator 103b is supplied to an inverting amplifier 105. Output of the inverting amplifier 105 in turn is provided to the second laser diode 12b. A modulation current, such as a triangle wave from the chirp generator 103a and an inverted triangle wave from the inverting amplifier 105, is added to the DC bias supplied by the DC power source 101a and 101b, respectively. A trigger 107 ensures simultaneous operation of the chirp generators 103a and 103b. Because the frequencies of the laser diodes 12a and 12b are modulated, the laser 12 may be considered a chirped laser and, accordingly, the system 10 may be considered a chirped laser radar.

The beams from the laser diodes 12a and 12b are sent through an optical fiber and are combined in a splitter 40. The combined beam is sent from the splitter 40 through an optical fiber to a splitter 80. The combined beam is sent from the splitter 80 through an optical fiber 88 with a flat, polished end 86. The combined beam exits the end 86 and is transmitted to the target 14.

A photodiode detector 82 is also optically coupled to the splitter 80. Output of the photodetector diode 82 is provided to an input interface 21 of a processor 20, where the output of the photodiode 82 undergoes an analog-to-digital conversion (ADC) and is further processed as discussed below. The processor 20 is any acceptable signal processor known in the art. Given by way of non-limiting example, the processor 20 suitably is a digital signal processor such as an Alacron Digital Signal Processor, a field programmable gate array (FPGA) with operations at up to around 3,000 points per second, and the like.

A natural, Fresnel reflection of around four percent or so of the combined beam reflects from the end 86. A return signal from the target 14 enters the optical fiber at the end 86. The return signal from the target 14 and the natural, Fresnel reflection from the end 86 combine to form an interference signal. The interference signal is sent through the optical fiber to the splitter 80 and is detected by the photodiode detector 82. The detected interference signal is provided by the photodiode detector 82 to the processor 20 for processing as described below.

A reference interferometer 44 includes reference channels 44a, 44b, and 44c that each include optical fibers of a known length. As will be discussed below, determining and comparing frequency of signals from the reference channels 44a, 44b, and 44c with frequency of the interference signal advantageously enables embodiments of the present invention to determine range to the target 14.

The splitter 40 provides via an optical fiber a portion of the combined laser beams to a splitter 48 that, in turn, provides the portion of the combined laser beams to a reference interferometer 44. The reference interferometer 44 includes three reference channels 44a, 44b, 44c. A portion of the combined laser beams is supplied via an optical fiber to the reference channel 44a from the splitter 48. A portion of the combined laser beams is supplied via an optical fiber from the splitter 48 to a splitter 68 that, in turn, supplies the portion of the combined laser beams via optical fibers to the reference channels 44b and 44c.

The reference channel 44a includes a splitter 54 that receives the portion of the combined laser beams from the splitter 48. An optical fiber 60 with flat, polished ends 62 and 64 is optically coupled to the splitter 54 at the end 62. The optical fiber 60 has a predetermined, known length $l_1$. The length $l_1$ is selected to be approximately around one-half the expected distance to the target 14—that is, around one-half of the maximum length that is expected to be measured. For example, in one present embodiment, the length $l_1$ is around 2 meters because the maximum range expected to be measured is around 4 meters.

A photodiode detector 56 is also optically coupled to the splitter 54. Output of the photodetector diode 56 is provided to the input interface 21 of the processor 20. At the processor 20, the output of the photodiode 56 is sampled, undergoes an analog-to-digital conversion (ADC), and is further processed as discussed below.

The portion of the combined beams is sent from the splitter 54 through the optical fiber 60. A natural, Fresnel reflection of around four percent or so of the portion of the combined beam reflects from the end 62. The rest of the portion of the combined beam exits the end 62 and is sent through the optical fiber 60 along its length $l_1$ to the end 64. A natural, Fresnel reflection of around four percent or so of the portion of the combined beam that has been sent to the end 64 reflects from the end 64. The natural, Fresnel reflections from the ends 62 and 64 combine to form a reference interference signal. The reference interference signal is sent to the splitter 54 and is detected by the photodiode detector 56. The detected reference interference signal is provided by the photodiode detector 54 to the processor 20 for processing as described below.

The reference channels 44b and 44c are constructed in a similar manner. The reference channel 44b includes a splitter 54' and photodiode detector 56', and an optical fiber 60' with flat, polished ends 62' and 64'. However, the optical fiber 60' has a predetermined, known length $l_2$ that is different from the length $l_1$. Likewise, the reference channel 44c includes a splitter 54" and photodiode detector 56", and an optical fiber 60" with flat, polished ends 62" and 64". However, the optical fiber 60" has a predetermined, known length $l_3$ that is different from the lengths $l_1$ and $l_2$. The lengths $l_2$ and $l_3$ are used to compute the integral phase for the reference length $l_1$. The shorter of the lengths (computed from the difference between the lengths $l_2$ and $l_3$) is short enough such that the normal drift of the wavelength of the laser does not cause more than one cycle change in the measured phase. Then the longer length is chosen to provide a convenient frequency to be a substantial fraction of the length $l_1$. In one present embodiment, the difference between the lengths $l_2$ and $l_3$ is around 174 mm, and the length $l_2$ is around 823.5 mm.

Another exemplary host environment that produces signals that may be processed by embodiments of the present invention is a chirped synthetic wavelength laser radar set forth in U.S. Pat. No. 5,371,587, issued to Peter J. deGroot et al., and assigned to The Boeing Company, the entire contents of which are incorporated by reference.

Now that an exemplary system environment has been set forth by way of non-limiting example, processing of the signals will now be explained.

Signal Processing

Embodiments of the present invention provide signal processing that determines parameters related to phase and/or frequency of sinusoidal signals in the presence of non-linearities in the frequency modulation of the source, such as laser diodes of a laser radar, more accurately than the prior art. According to embodiments of the present invention, use of time-resolved frequency analysis permits comparing results between a known, reference length and the distance to the target that is desired to be measured. Advantageously, this approach is applicable to frequency-based implementations, such as a chirped laser radar, as well as phase-based implementations, such as synthetic wave interferometry. An especially advantageous implementation of signal processing according to an embodiment of the present invention allows for determining range to a target.

Signal processing routines described herein suitably are executed by the processor 20 responsive to commands or instructions contained in a software program. The software program may be a computer software program product with executable computer software program code stored on storage media, such as without limitation a CD-ROM, a flash disk, an optical disk, a floppy disk, or the like, and loaded into random-access-memory (RAM) of the processor 20. Alternately, the software program may be burned into non-volatile memory, such as electrically-erasable programmable read-only memory (EEPROM), flash EEPROM, or the like, of the processor 20, if applicable.

Figure 2:
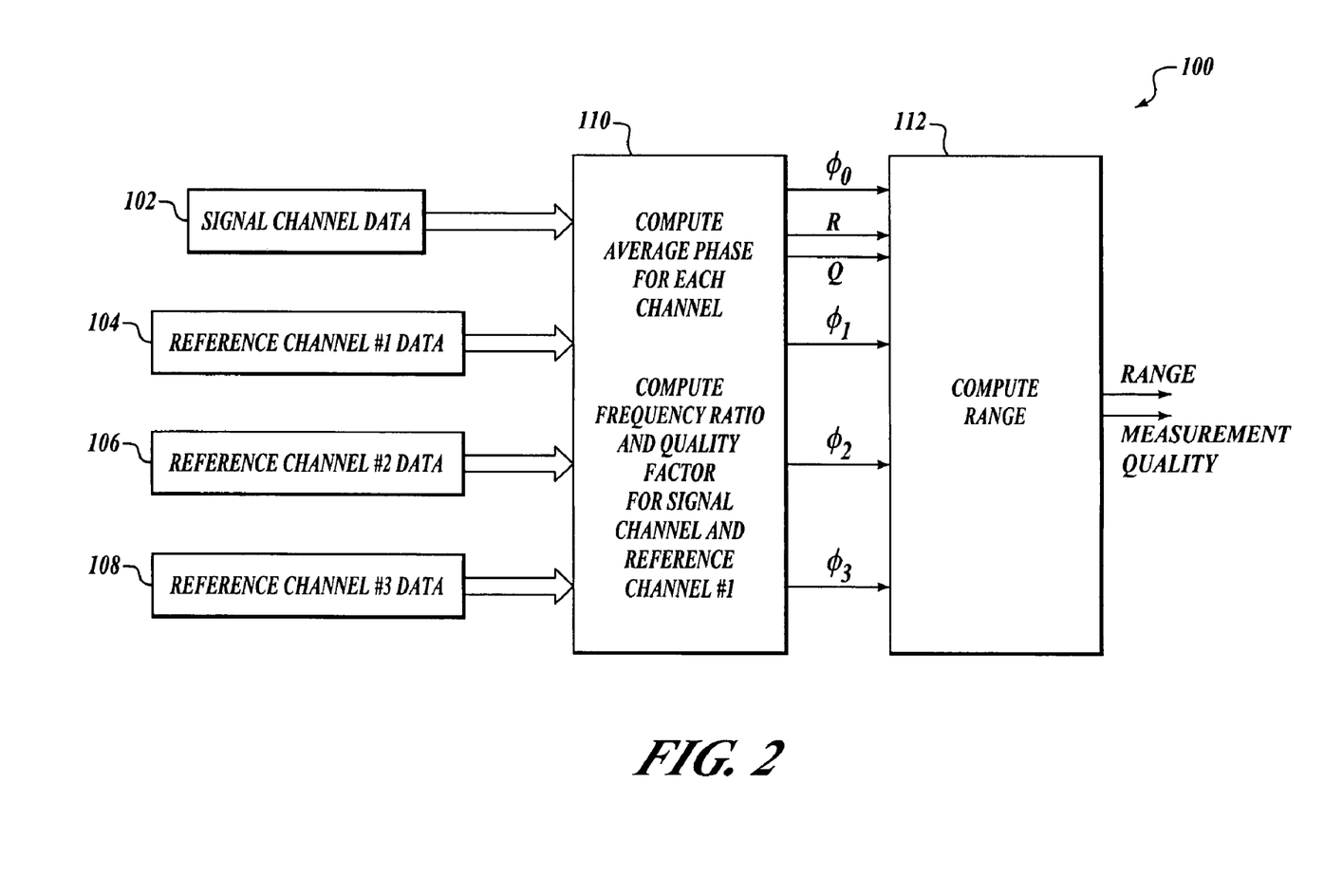
FIG. 2 is a block diagram of signal processing according to an embodiment of the present invention.

Referring additionally now to FIG. 2 and by way of overview, an exemplary routine 100 processes signals according to an embodiment of the present invention. At a block 102 signal channel data for the interference signal from the photodiode detector 82 (referred to herein as a "signal channel") is input. At a block 104 reference interference signal data from the reference channel 44a is input. At a block 106 reference interference signal data from the reference channel 44b is input. At a block 108 reference interference signal data from the reference channel 44c is input.

At a block 110 an average phase $\varnothing_0$ is computed for the interference signal from the signal channel, and average phases $\varnothing_1$, $\varnothing_2$, and $\varnothing_3$ are computed for the reference interference signals from the reference channels 44a, 44b, and 44c, respectively. At the block 110, a frequency ratio R and a quality factor Q are computed for the signal channel and the reference channel 44a.

Although neither phase nor frequency are well defined quantities for a time-varying single tone, the slope of a plot of phase versus time or the average phase value is repeatable and is a fairly precise quantity. According to embodiments of the present invention, in the case of a chirped laser radar that uses a reference length (such as the reference channels 44a, 44b, and 44c), comparison of the slopes or the average phases advantageously provides a measure of distance to the target that is as accurate as if the frequency of the chirp were completely linear.

Still by way of overview, phase is measured as a function of time within a signal that is composed of narrow bandwidth sinusoids in random noise. A measurement indicative of frequency, referred to simply as "frequency" for sake of clarity, is derived as the slope of the phase-versus-time function and phase is defined as the average phase over the measured time interval. Frequency in this case refers to the frequency term in a cosine function. Because the frequency of the signal varies, there is an array of frequency terms. According to embodiments of the present invention, a linear fit through the phases yields a measurement indicative of frequency. Measuring this quantity that is indicative of frequency and then comparing that quantity between the signal channel and the reference channel can yield stable results. Advantageously and as a result, uncertainty in measurement of a varying signal in random noise is reduced over conventional measurement techniques that perform a Fourier transform over the entire time interval of the signal.

At a block 112, range and measurement quality are computed from the average phases $\varnothing_0$, $\varnothing_1$, $\varnothing_2$, and $\varnothing_3$, the ratio R, and the quality factor Q. Details regarding the processing blocks will be explained below.

Figure 3:
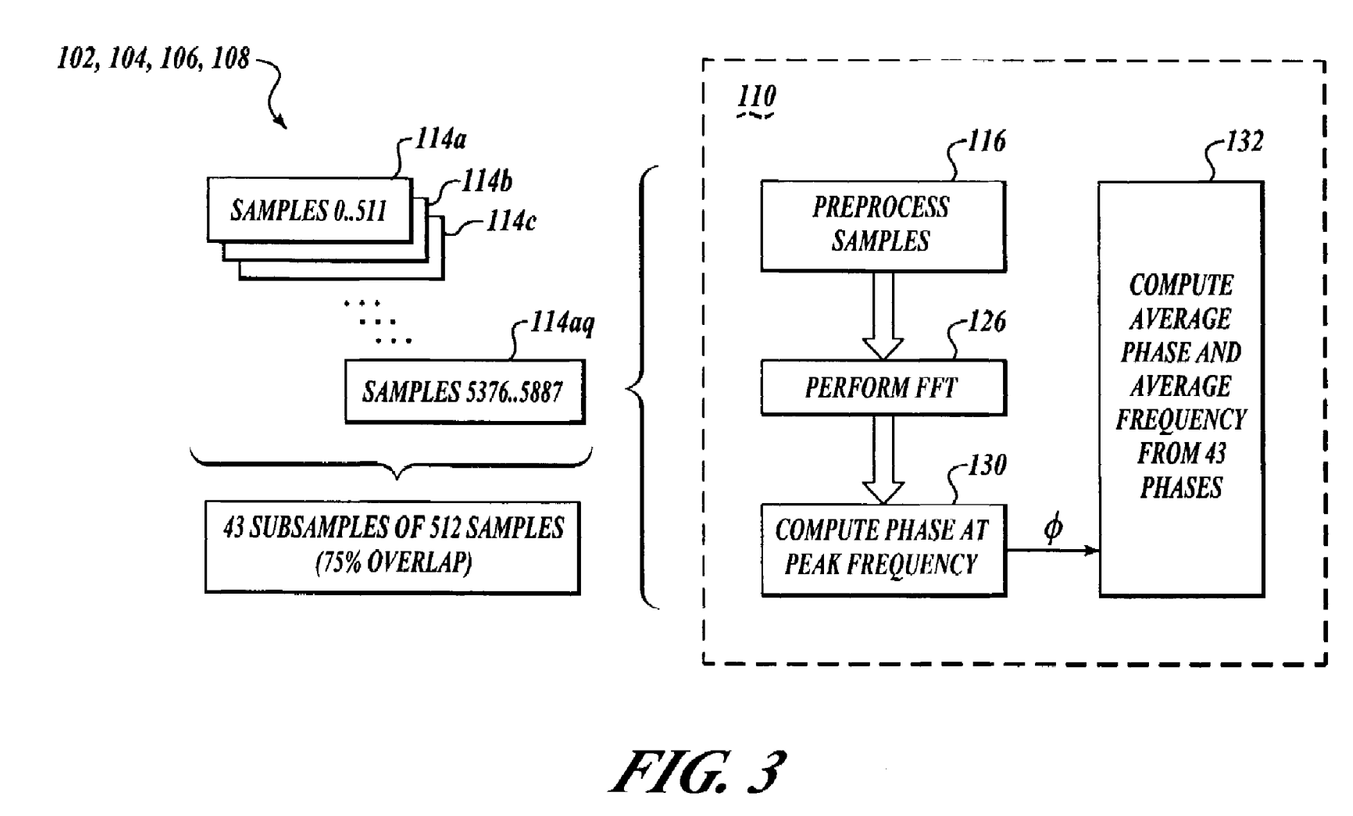
FIG. 3 is a top-level software block diagram of phase calculation according to an embodiment of the present invention.

Referring additionally to FIG. 3, at the blocks 102, 104, 106, and 108 data is sampled over one-half cycle of modulation (corresponding to a monotonic portion of the triangle wave generator's signals). Advantageously, a group of samples—referred to as a subinterval or a subsample—overlaps adjacent groups of samples (that is, adjacent subsamples). It is the subsample on which a Fourier transform is performed to extract frequency and phase. This approach presents two competing issues. First, it is desirable that the time centers of the subsamples be close together because the integral phase is estimated from the measured frequency. The shorter the time interval, the more likely that a mistake is not made (such as slipping a modulation cycle). Second, if the subsample is larger, the accuracy with which frequency and phase can be determined is better. Overlapping advantageously affords the benefits of shorter time intervals (thereby reducing probability of mistakes) as well as the benefits of longer time intervals (thereby increasing accuracy), at the cost of more computation. Use of subintervals also permits more than one sinusoid in the signal (assuming that spectral peaks are sufficiently well-separated).

In an exemplary and non-limiting embodiment, forty-three subsamples are taken. Each subsample includes 512 sample points and has a seventy-five percent overlap of common sample points with adjacent subsamples. However, it will be appreciated that any number of sample points and any amount of overlap may be selected as desired for a particular application. For example, by selecting a step size of 128 points (25% of the subsample size), it follows that a subsample 114a includes sample points 0-511; a subsample 114b includes sample points 127-639; a subsample 114c includes sample points 255-767; and so on through a subsample 114aq (that is, the forty-third subsample) that includes sample points 5376-5887.

At a block 116, the sample points in the subsamples 114a-114aq are preprocessed. Referring additionally to FIGS. 4A-4D, details are set forth regarding the pre-processing performed at the block 116. A time series 118 (FIG. 4A) of a sinusoidal signal is representative of any one of the subsamples 114a-114aq (FIG. 3). The time series 118 may be the interference signal from the signal channel or any of the reference interference signals from any of the reference channels 44a, 44b, or 44c.

Figure 4A:
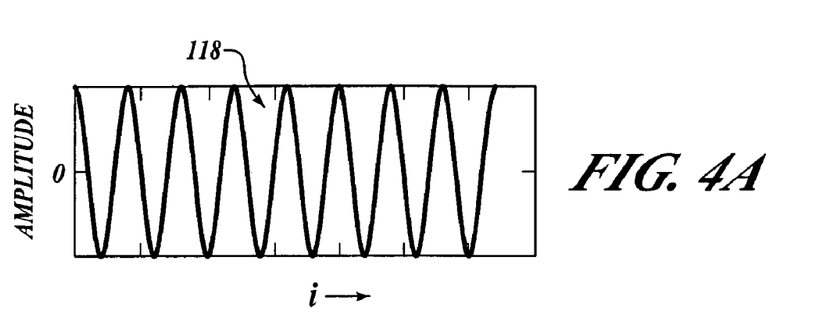
FIGS. 4A-4D are illustrations of pre-processing of samples according to an embodiment of the present invention.
Figure 4B:
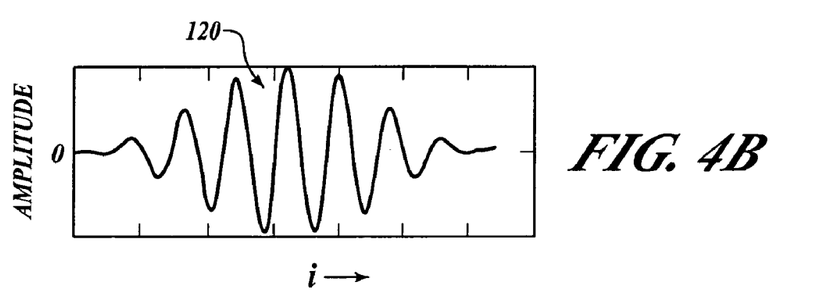

The time series 118 is filtered, thereby resulting in a filtered time series 120 (FIG. 4B). Filtering advantageously damps down side lobes. Any filter function may be applied as desired, including without limitation a Kaiser-Bessel filter, a Chebycheff filter, a Hamming filter, or the like. In one presently preferred embodiment, a Kaiser-Bessel filter is applied because a Kaiser Bessel allows the width to be tuned smoothly. The Kaiser-Bessel filter window may be implemented as a look-up table resident in storage (not shown) in the processor 20. Given by way of non-limiting example, the look-up-table may implement weighting coefficients for the Kaiser-Bessel filter function as 8-bit integers.

Figure 4C:
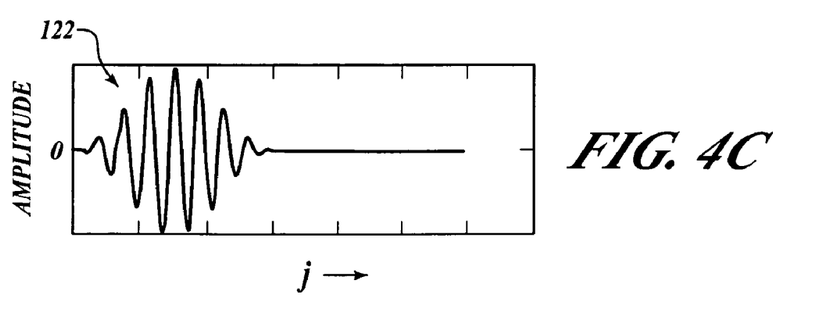

A zero-padded time series 122 (FIG. 4C) is created by adding sample points that are all zeroes onto the end of the time series 120 (FIG. 4B) (referred to as "zero padding"). The number of zero sample points may be the same as the number of sample points in the subsample that makes up the time series 120. Given by way of non-limiting example, 512 zero sample points may be added onto the end of the time series 120, thereby populating the time series 122 with 1,024 sample points. Zero padding the time series 120 to create the time series 122 increases resolution because the number of sample points is increased. In the non-limiting example illustrated herein, the time series 122 contains twice the number of sample points as does the time series 120.

Figure 4D:
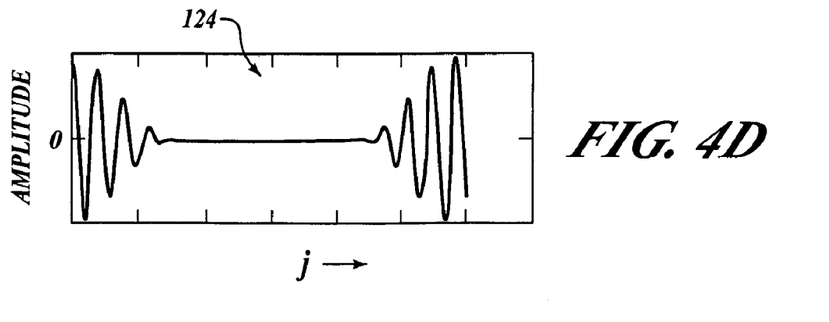

The zero-padded time series 122 is rotated by a predetermined amount, thereby resulting in a rotated time series 124 (FIG. 4D). Any amount of rotation may be used as desired for a particular application. Given by way of non-limiting example, the zero-padded time series 122 has been rotated by around twenty-five percent or so to create the rotated time series 124. It is noted that the middle of the function of the rotated time series 124 is at the ends of window. The data is rotated to determine the phase at the center of the subsample (where it has better noise characteristics). A Fourier transform evaluated for phase determines phase at the beginning of the time series being evaluated. Rotating the data puts the middle of the time series and the point at which the phase is being measured at the same spot—that is, the beginning of the time series. Putting the phase at the center of the time series reduces noise because there is less variation over a set of identical samples than measurements made at either the beginning or the end of the time series.

Referring back to FIG. 3, at a block 126 a Fourier transform is performed on the rotated time series 124 (FIG. 4D). The Fourier transform may be implemented as a fast Fourier transform (FFT) in a known manner. It will be noted again that the original interference signal has been sampled in overlapping subsamples—such as, for example, the forty-three overlapping subsamples 114a-114aq.

Figure 5A:
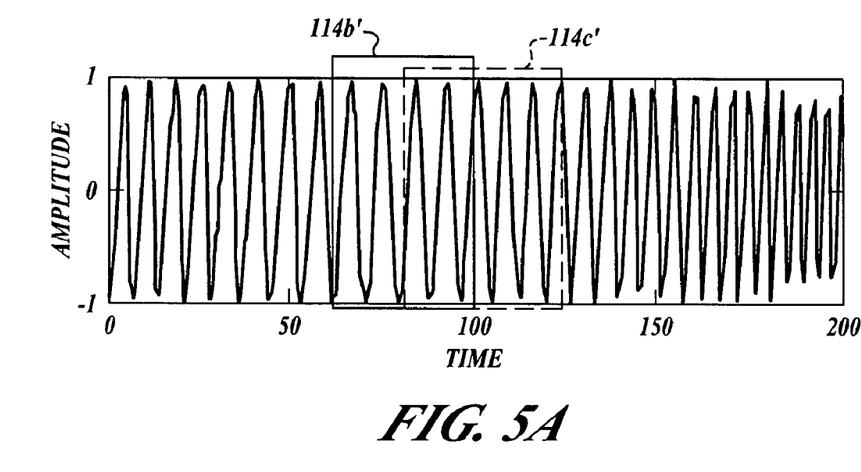
FIGS. 5A and 5B are illustrations of an exemplary time series interval and its Fourier transform.
Figure 5B:
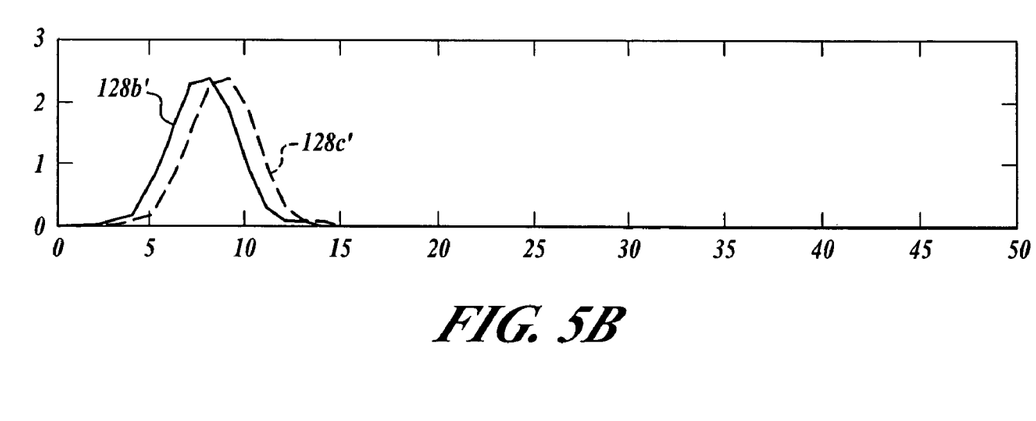

For example, referring additionally to FIGS. 5A and 5B, a subinterval 114b' is a graphical illustration of interference signal amplitude versus time that is sampled in the 512 samples of the subsample 114b (FIG. 3). A subinterval 114c', that overlaps the subinterval 114b', is a graphical illustration of interference signal amplitude versus time that is sampled in the 512 samples of the subsample 114c (FIG. 3). A graph 128b' illustrates a Fourier transform of the rotated time series 124 derived from the subinterval 114b' and a graph 128c' illustrates a Fourier transform of the rotated time series 124 derived from the subinterval 114c'.

Because the Fourier transform is performed on each rotated time series 124, and each rotated time series 124 represents only one subsample, the Fourier transform is performed on only a subinterval of the original time-sampled interference signal. Performing the Fourier transform on the subinterval advantageously results in a Fourier transform peak that is significantly narrower than broad Fourier transform peaks performed on entire intervals of signals as known in the prior art. This subinterval Fourier transform processing advantageously results in more accurate determinations of phase and/or frequency than processing of entire signal intervals according to the prior art.

The Fourier transform may be performed as an FFT in any acceptable manner as desired for a particular application. Imaginary values are input as zeroes. Given by way of non-limiting example, the FFT may use 1024 floating point input values with 64-bit floating point arithmetic. As a further example, the FFT may use 512 20-bit integer input values with 32-bit fixed point arithmetic.

Referring back to FIG. 3, at a block 130 phase at peak frequency is computed. From the Fourier transform, phase at the center of the subinterval is obtained using peak finding and phase interpolation methods. In one presently preferred embodiment, the approach for determining phase is as follows. Given real and imaginary FFT results R(x) and I(x), power is computed:

$$P(x)=R(x)*R(x)+I(x)*I(x) \quad (1)$$

Indices of two highest local maxima values are found where indices are each greater than 14 and differing by at least 14 in magnitude (the preceding values of 14 are replaced with 5 for signals from reference channels 44b and 44c). At each index, peak frequency and fractional phase are computed. Finally, total phase is computed.

Peak frequency is computed as follows. Given power P(x) and a local maximum index i, peak frequency is computed from a parabolic fit of power on either side of the index i:

$$dP(i+1)=P(i+1)-P(i) \quad (2)$$

$$dP(i-1)=P(i-1)-P(i) \quad (3)$$

$$f=i-(dP(i+1)-dP(i-1))/(dP(i+1)+dP(i-1))/2 \quad (4)$$

Fractional phase is computed as follows. Given real and imaginary FFT results R(x) and I(x) and given peak frequency f, fractional phase is computed via linear interpolation:

$$j=\text{Floor}(f) \text{ and } k=\text{Ceil}(f) \quad (5)$$

$$R\$=R(j)+(R(k)-R(j))*(f-j) \quad (6)$$

$$I\$=I(j)+(I(k)-I(j))*(f-j) \quad (7)$$

$$\phi=-\arctan2(I\$,R\$)/2\pi \quad (8)$$

Combined values for frequency and phase are next computed, and then total phase is computed. Given peak frequencies $f_1$ and $f_2$ associated with the two local maxima previously determined, and given corresponding fractional phases $\phi_1$ and $\phi_2$, combined frequency and phase are computed:

$$f=f_1+f_2 \text{ (units are cycles/transform)} \quad (9)$$

$$\phi=\phi_1+\phi_2 \text{ (units are cycles)} \quad (10)$$

Total phase is computed by adding integer cycles relative to phase from preceding subsample:

$$\emptyset=\phi+\text{Round }(\emptyset\$-\phi+(f\$+f)/2\alpha) \quad (11)$$

where
f$=combined frequency from preceding subsample;
Ø$=total phase from preceding subsample;
initial value of f$ and Ø$ are zero; and
α=transform size/step size (units are steps/transform).

Referring back to FIG. 3, at a block 132 average phase and average frequency is computed from the total phases that have been previously computed as described above by equations (1)-(11). Given total phases Ø(x) and where x=0..n-1 (where n=number of subsamples), average phase is computed:

$$\emptyset=\Sigma\emptyset(x)/n \quad (12)$$

Figure 6:
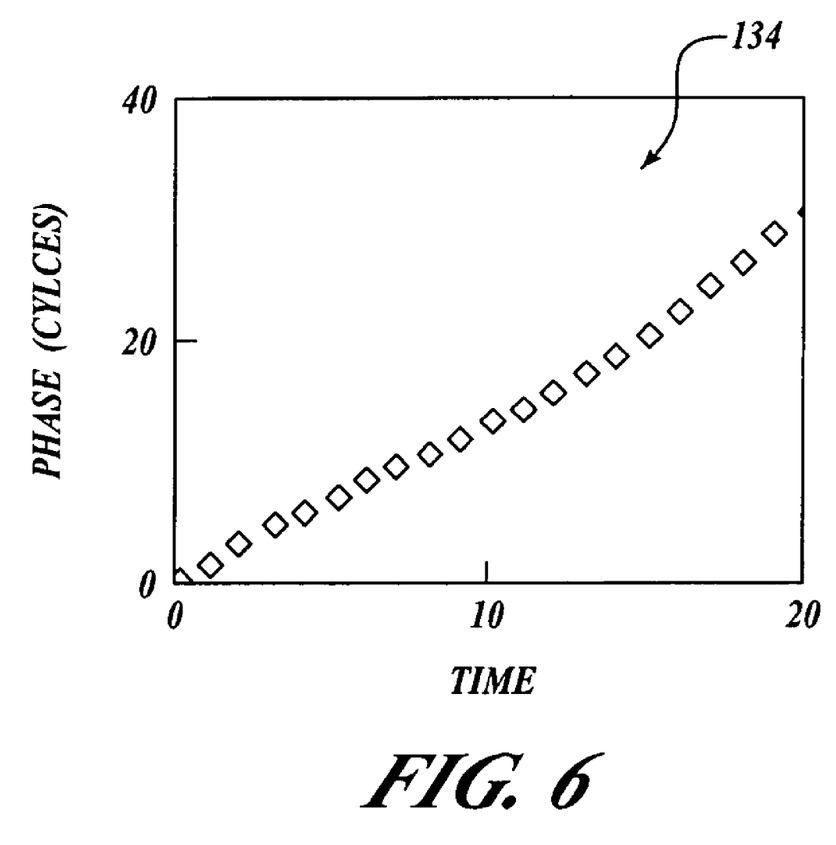
FIG. 6 is an illustration of an exemplary phase-versus-time plot derived from a time series.

Referring additionally to FIG. 6, a plot 134 of phase versus time has a slope with substantially little variation. As such, a linear fit through the phase data can be made and a frequency can be associated with the slope of the linear fit through the phase data. Average frequency for the signal channel interference signal and the reference interference signal from the first reference channel 44a is computed from slope of phase as follows.

$$\delta=\Sigma(\emptyset(x)*x)-\emptyset*\beta \text{(units are arbitrary)} \quad (13)$$

where

β is a constant based on step size and n.

Average frequency is not computed for the second and third reference channels 44b and 44c because frequency is not used to estimate the integer phase for the reference channels. The integer phase is estimated from the known ratios of the lengths $l_1$, $l_2$, and $l_3$. It is only on the measured length to the target that the integer phase is estimated from the chirp frequencies.

The ratio R of average frequencies is computed as follows:

$$R=\delta_0/\delta_1 \text{(unitless)} \quad (14)$$

Referring back to FIG. 2, in an exemplary embodiment range is computed at the block 112 using an iterative process as follows. Given average phases for the second and third reference channels 44b and 44c and given lengths of the second and third reference channels 44b and 44c, an estimate is made for synthetic wavelength λ. It will be noted that different values are used for up-chirp and down-chirp data—one of which will be negative.

A difference in average phases is used to make first refinement:

$$\emptyset_{23}=(\emptyset_2-\emptyset_3) \quad (15)$$

$$\text{Length}_{23}(\text{Length}_2-\text{Length}_3) \quad (16)$$

$$\lambda'=\text{Length}_{23}/(\emptyset_{23}+\text{Round }(\text{Length}_{23}/\lambda-\emptyset_{23})) \quad (17)$$

Average phase for the third reference channel 44c is used to make a second refinement of synthetic wavelength:

$$\lambda''=\text{Length}_3/(\emptyset_3+\text{Round}(\text{Length}_3/\lambda'-\emptyset_3)) \quad (18)$$

Given average phases for the interference signal for the signal channel and for the reference interference signal for the first reference channel 44a, and given length of the first reference channel 44a, and given the ratio R of average frequencies, average phase for the first reference channel 44a is used to make a final refinement of synthetic wavelength:

$$\lambda\$=\text{Length}_1/(\emptyset_1+\text{Round}(\text{Length}_1/\lambda''-\emptyset_1)) \quad (19)$$

The average phase for the signal channel and the ratio R of average frequencies are used to compute range:

$$\text{Range}=(\lambda\$*(\emptyset_0+\text{Round}(\text{Length}_1R/\lambda\$-\emptyset_0))/2 \quad (20)$$

However, it will be appreciated that a ratio of the phases is also directly proportional to a ratio of distance to the target and length of the first reference channel 44a.

While the preferred embodiment of the invention has been illustrated and described, as noted above, many changes can be made without departing from the spirit and scope of the invention. Accordingly, the scope of the invention is not limited by the disclosure of the preferred embodiment. Instead, the invention should be determined entirely by reference to the claims that follow.

What is claimed is:

1. A method for processing a signal, the method comprising:
sampling a sinusoidal signal over a finite period of time at a plurality of subintervals;
pre-processing the plurality of sampled subinterval signals, wherein pre-processing includes:
filtering the plurality of sampled subinterval signals;
creating a zero-padded sample by adding to the sampled subinterval signal a plurality of sample points that are all zeroes; and rotating the zero-padded sample by a predetermined amount such that a first part of the zero-padded sample that is near a midpoint of the sinusoidal signal is placed at a first end of a sample window and a second part of the zero-padded sample that is near the midpoint of the sinusoidal signal is placed at a second end of the sample window;

performing a Fourier transform on the plurality of pre-processed sampled subinterval signals;

extracting phases of the plurality of pre-processed sampled subinterval signals from the Fourier transform; and determining a parameter indicative of frequency of the sinusoidal signal from the slope of the phases of the plurality of pre-processes sampled subinterval signals.

2. The method of claim 1, wherein determining the parameter indicative of frequency includes performing a linear fit through a plurality of data points that define the slope of the phase.

3. A system for processing a signal, the system comprising:
an input interface configured to receive a sinusoidal signal; and
a processor including:
a first component configured to sample the sinusoidal signal over a finite period of time at a plurality of subintervals;
a second component configured to pre-process the plurality of sampled subinterval signals, the second component being further configured to:
filter the sampled subinterval signals;
create a zero-padded sample by adding to the filtered sample subinterval signals a plurality of sample points that are all zeroes; and
rotate the zero-padded sample by a predetermined amount such that a first part of the zero-padded sample that is near a midpoint of the sinusoidal signal is placed at a first end of a sample window and a second part of the zero-padded sample that is near the midpoint of the sinusoidal signal is placed at a second end of the sample window;
a third component configured to perform a Fourier transform on the plurality of pre-processed sampled subinterval signals;
a fourth component configured to extract phases of the plurality of pre-processed sampled subinterval signals from the Fourier transform; and
a fifth component configured to determine a parameter indicative of frequency of the sinusoidal signal from the slope of the phases of the plurality of pre-processed sampled subinterval signals.

4. The system of claim 3, wherein the fifth component is configured to perform a linear fit through a plurality of data points that define the slope of the phase.

5. A computer software program product for processing a signal, the computer software program product comprising:
first computer software program code means for sampling a sinusoidal signal over a finite period of time at a plurality of subintervals;
second computer software program code means for pre-processing the plurality of sampled subinterval signals, wherein the second computer software program code means is further configured to:
filter the sampled subinterval signals;
create a zero-padded sample by adding to the filtered sampled subinterval signal a plurality of sample points that are all zeroes; and
rotate the zero-padded sample by a predetermined amount such that a first part of the zero-padded sample that is near a midpoint of the sinusoidal signal is placed at a first end of a sample window and a second part of the zero-padded sample that is near the midpoint of the sinusoidal signal is placed at a second end of the sample window;
third computer software program code means for performing a Fourier transform on the plurality of pre-processed sampled subinterval signals;
fourth computer software program code means for extracting phases of the plurality of pre-processed sampled subinterval signals from the Fourier transform; and
fifth computer software program code means for determining a parameter indicative of frequency of the sinusoidal signal from the slope of the phases of the plurality of pre-processed sampled subinterval signals.

6. The computer software program product of claim 5 wherein the filter includes a Kaiser-Bessel window.

7. The computer software program product of claim 5 wherein the fifth computer software program code means is configured to perform a linear fit through a plurality of data points that define the slope of the phase.

8. A system for determining distance to a target, the system comprising:
two laser beam sources having a relative frequency separation;
a frequency modulator for the two laser sources;
a beam combiner arranged to combine the two frequency-modulated laser beams;
a detector configured to detect an interference signal created by mixing a return signal from target with a portion of the combined laser beams;
a reference interferometer configured to generate at least one reference interference signal; and
a processor including:
a first component configured to sample the detected interference signal over a finite period of time;
a second component configured to pre-process the sampled interference signal,
the second component being further configured to:
filter the sampled subinterval signals;
create a zero-padded sample by adding to the filtered sampled subinterval signals a plurality of sample points that are all zeroes; and
rotate the zero-padded sample by a predetermined amount such that a first part of the zero-padded sample that is near a midpoint of the sinusoidal signal is placed at a first end of a sample window and a second part of the zero-padded sample that is near the midpoint of the sinusoidal signal is placed at a second end of the sample window;
a third component configured to perform a Fourier transform on the pre-processed signal;
a fourth component configured to extract phase of the detected interference signal from the Fourier transform;
a fifth component configured to determine a parameter indicative of frequency of the detected interference signal from slope of the phase; and
a sixth component configured to determine range to the target based on a comparison of frequency of the detected interference signal with frequency of the at least one reference interference signal.

9. The system of claim 8 wherein the fifth component is configured to perform a linear fit through a plurality of data points that define the slope of the phase.

10. A system for determining distance to a target, the system comprising:
- two laser beam sources having a relative frequency separation;
- a frequency modulator for the two laser sources;
- a beam combiner arranged to combine the two frequency-modulated laser beams;
- a detector configured to detect an interference signal created by mixing a return signal from target with a portion of the combined laser beams;
- a reference interferometer configured to generate at least one reference interference signal; and
- a processor including:
  - a first component configured to sample the detected interference signal over a finite period of time;
  - a second component configured to pre-process the sampled interference signal, the second component being further configured to:
  - filter the sampled subinterval signals;
  - create a zero-padded sample by adding to the filtered sampled subinterval signals a plurality of sample points that are all zeroes; and
  - rotate the zero-padded sample by a predetermined amount such that a first part of the zero-padded sample that is near a midpoint of the sinusoidal signal is placed at a first end of a sample window and a second part of the zero-padded sample that is near the midpoint of the sinusoidal signal is placed at a second end of the sample window;
  - a third component configured to perform a Fourier transform on the pre-processed signal;
  - a fourth component configured to extract phase of the detected interference signal from the Fourier transform; and
  - a fifth component configured to determine range to the target based on a comparison of phase of the detected interference signal with phase of the at least one reference interference signal.

* * * * *